(12) United States Patent
Rousseville et al.

(10) Patent No.: US 8,519,388 B2
(45) Date of Patent: Aug. 27, 2013

(54) EMBEDDED STRUCTURE FOR PASSIVATION INTEGRITY TESTING

(75) Inventors: Lucie A. Rousseville, Waldolwisheim (FR); Sebastien Jacqueline, Bernieres sur Mer (FR); Patrice Gamand, Douvres la Delivrande (FR); Dominique Yon, Saint Aubin sur Mer (FR)

(73) Assignee: NXP B.V., Eindhoven (NL)

( * ) Notice: Subject to any disclaimer, the term of this patent is extended or adjusted under 35 U.S.C. 154(b) by 278 days.

(21) Appl. No.: 12/808,626

(22) PCT Filed: Dec. 17, 2008

(86) PCT No.: PCT/IB2008/055356
§ 371 (c)(1),
(2), (4) Date: Jun. 30, 2010

(87) PCT Pub. No.: WO2009/077986
PCT Pub. Date: Jun. 25, 2009

(65) Prior Publication Data
US 2011/0140104 A1 Jun. 16, 2011

(30) Foreign Application Priority Data
Dec. 17, 2007 (FR) .................................. 07 291538

(51) Int. Cl.
H01L 23/58 (2006.01)
H01L 29/10 (2006.01)
H01L 21/00 (2006.01)

(52) U.S. Cl.
USPC .................. 257/48; 257/E21.524; 438/17

(58) Field of Classification Search
USPC ............................................ 257/48; 438/17
See application file for complete search history.

(56) References Cited

U.S. PATENT DOCUMENTS 3,304,594 A * 2/1967 Madland ........................ 438/11
3,983,479 A   9/1976 Lee et al.
(Continued)

FOREIGN PATENT DOCUMENTS

GB 1081858 A 9/1967
JP 56114334 A 9/1981
(Continued)

OTHER PUBLICATIONS

International Search Report & Written Opinion for Application PCT/IB2008/055356 (December 17, 2008).

*Primary Examiner* — William D Coleman (57) ABSTRACT

The present invention relates to a method and system for testing integrity of a passivation layer (108) covering a semiconductor device. A structured layer of electrically conducting material (104) is deposited onto at least a portion of a top surface of a substrate (102) of the semiconductor device. The structured layer (104) comprises a plurality of bands (104.1, 104.2) connected to at least two contacts (106.1, 106.2) and disposed on the at least a portion of the top surface such that one of consecutive bands (104.1, 104.2) and consecutive portions of the bands (104.1, 104.2) are connected to different contacts (106.1, 106.2). A passivation layer (108) is deposited onto the at least a portion of the top surface of the substrate (102) and the structured layer (104) such that material of the passivation layer(108) is disposed between the bands of conducting material (104.1, 104.2) and on top of the structured layer (104). Electrically conducting material is then deposited onto the passivation layer (108) and a resistance is measured between the at least two contacts (106.1, 106.2). An indication with respect to integrity of the passivation layer (108) is determined in dependence upon the measured resistance.

8 Claims, 6 Drawing Sheets

(56) References Cited

U.S. PATENT DOCUMENTS

| | | | |
|---|---|---|---|
| 5,731,587 A * | 3/1998 | DiBattista et al. | 250/443.1 |
| 6,720,712 B2 * | 4/2004 | Scott et al. | 310/339 |
| 6,929,963 B1 | 8/2005 | Kim | |
| 7,187,179 B1 * | 3/2007 | Scaman et al. | 324/512 |
| 7,714,277 B2 * | 5/2010 | Wilks et al. | 250/287 |
| 2003/0186473 A1 | 10/2003 | Rumsey et al. | |
| 2008/0122476 A1 * | 5/2008 | Wang et al. | 324/769 |
| 2010/0253380 A1 * | 10/2010 | Martin et al. | 324/763 |

FOREIGN PATENT DOCUMENTS

| | | |
|---|---|---|
| JP | 59 184540 A | 10/1984 |
| JP | 01 143237 A | 6/1989 |
| JP | 2168642 A | 6/1990 |
| JP | 2001 056310 A | 2/2001 |
| JP | 2004119460 A | 11/2004 |

\* cited by examiner

EMBEDDED STRUCTURE FOR PASSIVATION INTEGRITY TESTING

This invention relates generally to the field of semiconductor devices and more particularly to a method and system for testing integrity of a passivation layer covering a semiconductor device.

Semiconductor devices are used in most present day electrical and electronic devices. Fabrication of semiconductor devices comprises a multi-step sequence of photographic and chemical steps during which electronic circuits are gradually created on a wafer made of semiconducting material such as, for example, Silicon and various compounds thereof. The uppermost layer of a semiconductor device is called the passivation layer. The passivation layer protects the substrate from being damaged—for example, from being scratched during following manufacturing steps and the prevent contaminants from reaching the underlying layers.

Many observed failures of semiconductor devices have been attributed to defects such as, for example, pin holes and cracks, in the passivation layer. Defects in the passivation layer are created during deposition of the same as well as during post-deposition processing.

One method used for detecting defects in the passivation layer is the optical inspection using a microscope. However, using this method it is generally not possible to determine whether a defect has actually penetrated the passivation layer and, furthermore, it is nearly impossible to detect pin holes.

Other state of the art tests for determining the integrity of the passivation layer are chemical tests such as the orthophosphoric acid test. However, also the orthophosphoric acid test does not reveal all defects and it is not possible to use this test with organic passivation layers made of, for example, polyimide, since the acid consumes the polyimide.

It would be highly desirable to overcome these drawbacks and to provide a method and system for testing the integrity of a passivation layer covering a semiconductor device.

In accordance with the present invention there is provided a method for testing the integrity of a passivation layer. A structured layer of electrically conducting material is deposited onto at least a portion of a top surface of a substrate of the semiconductor device.

The structured layer comprises a plurality of bands connected to at least two contacts and disposed on the at least a portion of the top surface such that one of consecutive bands and consecutive portions of the bands are connected to different contacts. A passivation layer is deposited onto the at least a portion of the top surface of the substrate and the structured layer such that material of the passivation layer is disposed between the bands of conducting material and on top of the structured layer. Electrically conducting material is then deposited onto the passivation layer and a resistance is measured between the at least two contacts. An indication with respect to integrity of the passivation layer is determined in dependence upon the measured resistance.

In accordance with the present invention there is provided a method for testing the integrity of a passivation layer that further comprises interposing a layer of electrically conducting material having a contact and a layer of electrically insulating material between the top surface of the substrate and the structured layer and measuring a resistance between the contact of the layer of electrically conducting material and at least one of the at least two contact pads of the structured layer.

In accordance with the present invention there is further provided a system for testing the integrity of a passivation layer. The system comprises a substrate of a semiconductor device.

A structured layer of electrically conducting material is disposed on at least a portion of a top surface of the substrate. The structured layer comprises a plurality of bands connected to at least two contacts being disposed such that one of consecutive bands and consecutive portions of the bands are connected to different contacts. The at least two contacts are for being connected to electric circuitry for measuring a resistance between the at least two contacts and for providing a measurement signal in dependence thereupon. The measurement signal is indicative of an integrity of a passivation layer deposited onto the at least a portion of the top surface of the substrate and the structured layer, wherein the passivation layer is deposited such that material of the passivation layer is disposed between the bands of conducting material and on top of the structured layer.

In accordance with the present invention there is provided a method for testing the integrity of a passivation layer that further comprises a layer of electrically conducting material and a layer of electrically insulating material interposed between the top surface of the substrate and the structured layer. The layer of electrically conducting material comprises a contact for being connected to the electric circuitry for measuring a resistance between the contact of the layer of electrically conducting material and at least one of the at least two contact of the structured layer.

Exemplary embodiments of the invention will now be described in conjunction with the following drawings, in which.

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

Referring to FIG. 1, a cross-sectional view of a substrate of a semiconductor device having a first embodiment of an embedded structure 100 for testing the integrity of a passivation layer according to the invention is shown. On at least a portion of a top surface of the substrate 102 covering, for example, an area 103 above functional components of a chip such as, for example, a System On a Chip (SoC), a structured layer 104 of electrically conducting material is disposed. The structured layer 104 comprises a plurality of bands 104.1 and 104.2 connected to at least two contact pads 106.1 and 106.2, respectively, which are placed, for example, outside the area 103. The bands 104.1 and 104.2 are disposed such that one of consecutive bands 104.1 and 104.2 and consecutive portions of the bands 104.1 and 104.2 are connected to different contact pads, i.e. bands 104.1 are connected to contact pad 106.1 and bands 104.2 are connected to contact pad 106.2. A passivation layer 108 is deposited onto the at least a portion of the top surface of the substrate 102 and the structured layer 104 such that material of the passivation layer 108 is disposed between the bands 104.1 and 104.2 and on top of the structured layer 104 absent at least a predetermined portion of a surface area of each of the at least two contact pads 106.1 and 106.2. Optionally, an electrically insulating layer—for example, an oxide layer such as $SiO_2$—is interposed between the top surface of the substrate 102 and the structured layer 104, for example, when the substrate 102 has a metal layer as finishing.

Figure 1:
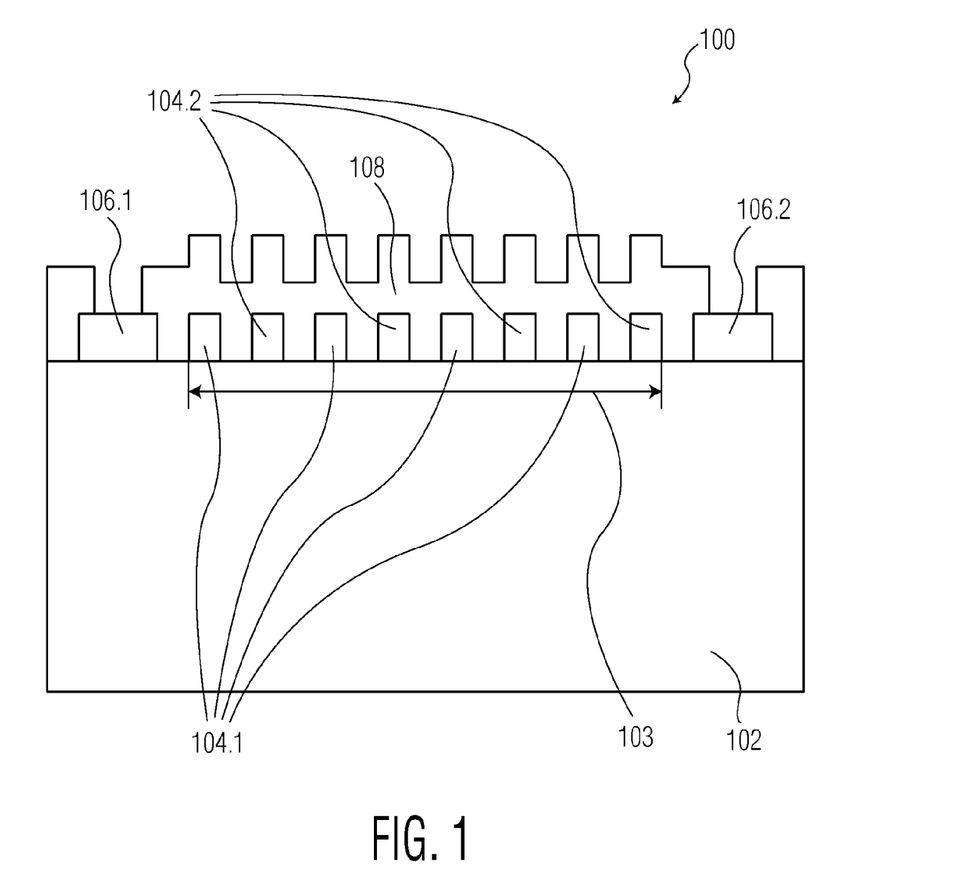
FIG. 1 is a simplified block diagram illustrating a cross-sectional view of a substrate of a semiconductor device having a first embodiment of an embedded structure for testing the integrity of a passivation layer according to the invention.

For example, the structured layer 104 is made of a metal such as aluminum, copper, or gold using, for example, standard thin film deposition techniques. The passivation layer 108 is made of, for example, polyimide, $SiO_2$, or $Si_3N_4$ using, for example, standard thin film deposition techniques.

Figure 2A:
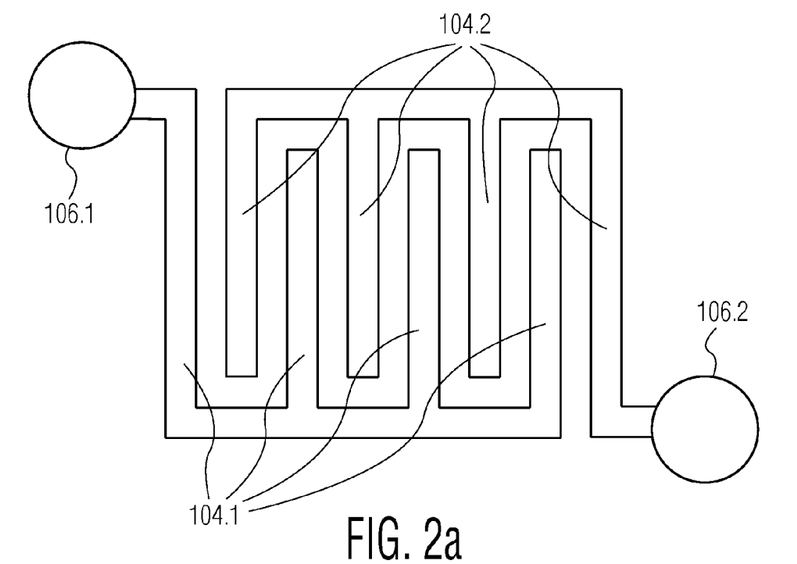
FIGS. 2a and 2b are simplified block diagrams of top views of two embodiments of a structured layer according to the invention of the embedded structure shown in FIG. 1.
Figure 2B:
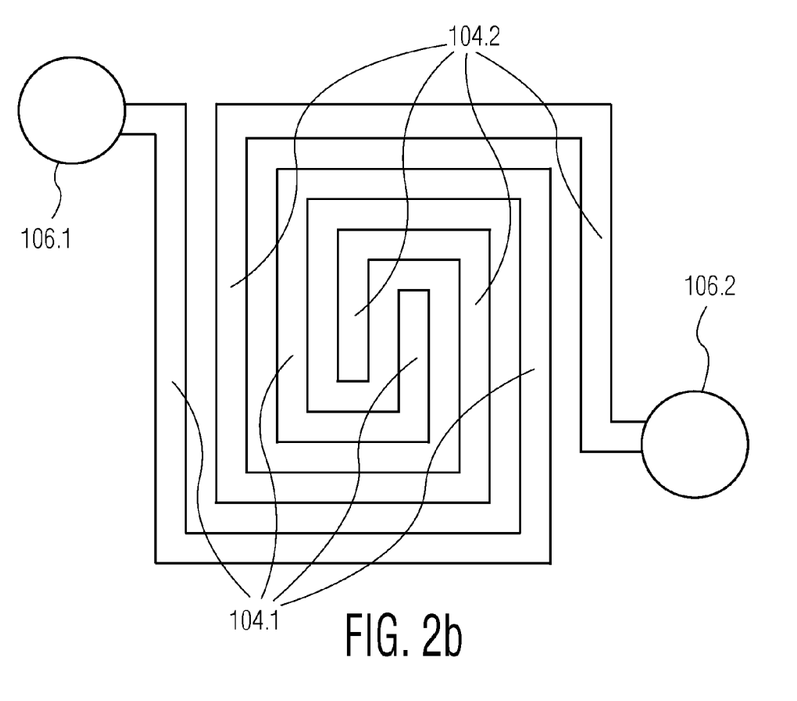

Referring to FIGS. 2a and 2b, top views of two embodiments of the structured layer 104 are shown. The structural layer 104, shown in FIG. 2a, comprises a plurality of substantially straight bands 104.1 and 104.2 that are oriented substantially parallel to each other, where the bands 104.1 are connected to the contact pad 106.1 and the bands 104.2 are connected to the contact pad 106.2 such that consecutive bands 104.1 and 104.2 are connected to a different contact pad 106.1 and 106.2, respectively. Alternatively, the structural layer 104, shown in FIG. 2b, comprises two bands 104.1 and 104.2 in the form of two intertwined spirals. As is evident, one of skill in the art will readily arrive at various other structures that provide one of consecutive bands 104.1 and 104.2 and consecutive portions of the bands 104.1 and 104.2 connected to different contact pads 106.1 and 106.2.

The bands 104.1 and 104.2 have a predetermined width and consecutive bands 104.1 and 104.2 or consecutive portions of the bands 104.1 and 104.2 are disposed at a predetermined distance to each other. For example, the width and the distance are determined such that detection of pinholes in the passivation layer 108 is enabled. For example, for a covered area 103 of 100 μm×100 μm—in a SoC application—the width and the distance are determined to be in a range of 0.1 μm to 10 μm. The provision of a plurality of consecutive bands or consecutive portions of bands results in a plurality of alternations of metal and non-metal and, therefore, in a non-planar cross section of the passivation layer 108 making the following measurements for the integrity testing more sensitive to defects.

Figure 3:
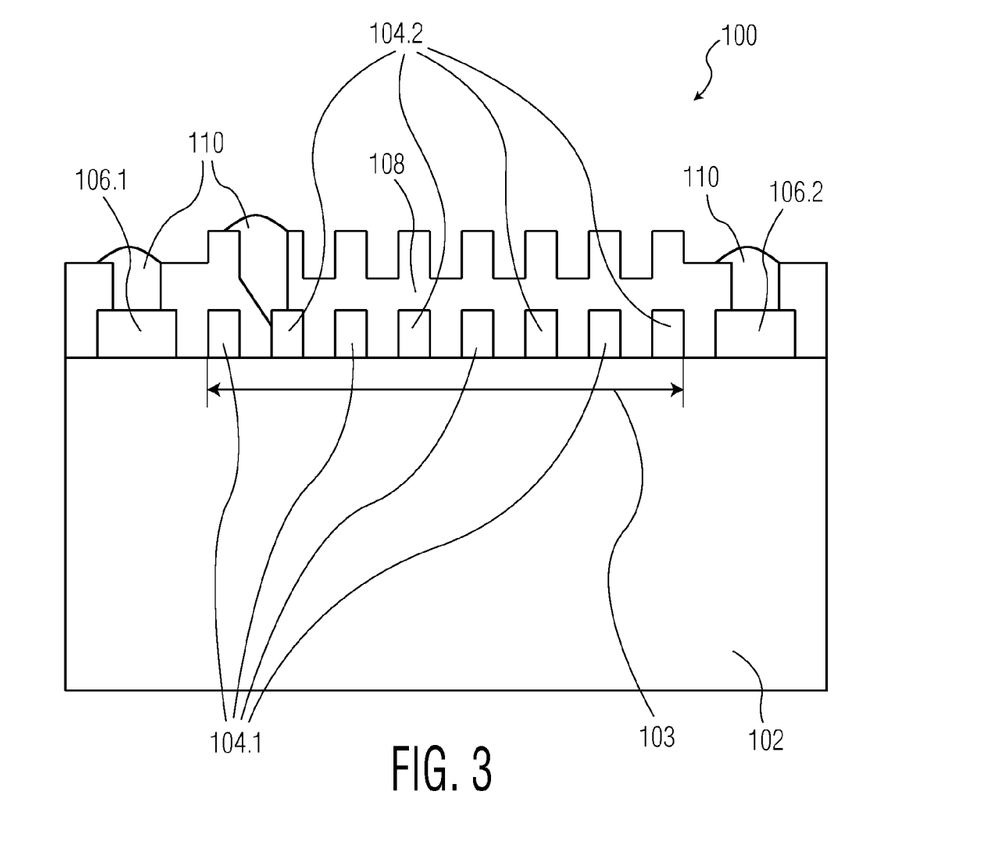
FIG. 3 is a simplified block diagram illustrating a cross-sectional view of the substrate shown in FIG. 1 having an electrically conducting material deposited onto the passivation layer according to the invention.

An electrically conducting material is then deposited onto the passivation layer 108 using, for example, an electroless deposition technique such as electroless Ni/immersion gold deposition. The deposition 110 primarily occurs on metallic surfaces such as the contact pads 106.1 and 106.2 and exposed portions of the structured layer 104—exposed through pinholes and cracks in the passivation layer 108—as illustrated in FIG. 3. Electroless Ni/immersion gold deposition is a well known technique and commonly used in electronics manufacturing. Of course, cleaning chemicals for surface cleaning prior deposition are chosen in dependence upon the material of the passivation layer, in particular, when the passivation layer comprises an organic material such as polyimide.

Figure 4:
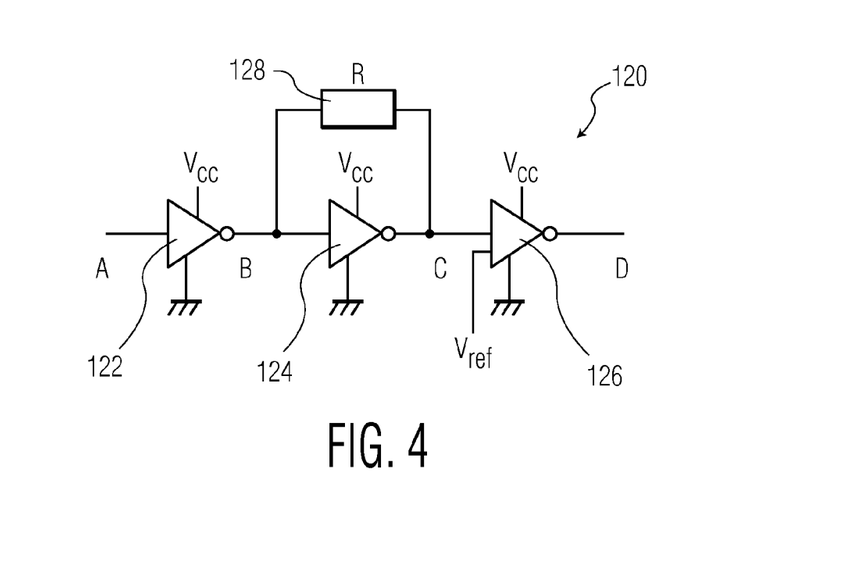
FIG. 4 is a simplified block diagram illustrating an electric circuitry for measuring a resistance between two contacts for determining the integrity of the passivation layer according to the invention.

The contact pads 106.1 and 106.2 are then connected to an electric circuitry 120 for measuring a resistance between the at least two contact pads 106.1 and 106.2. An example of an electric circuitry 120 suitable for this purpose is illustrated in FIG. 4, but as is evident to those skilled in the art, there are numerous other electric circuit designs applicable. The electric circuitry 120 comprises two inverters—122 and 124—and a voltage comparator 126. The second inverter 124 comprises a resistive feedback connected to measure a resistance R 128 between two contact pads.

In the presence of a defect in the passivation layer 108 the resistance R 128 is very low—<<10 Ohms Connecting A to ground—A=0—results in voltages at nodes B and C being substantially equal to a supply voltage $V_{CC}$, i.e. the voltage $V_C$ at node C is greater than a reference voltage $V_{ref}$ and, therefore, the voltage at node D is equal to the supply voltage $V_{CC}$. In absence of defects in the passivation layer 108 the resistance R 128 is large—>100.000 Ohms. Connecting A to ground—A=0—results in the voltage at node B being substantially equal to the supply voltage $V_{CC}$ and at the node C being substantially smaller than the supply voltage $V_{CC}$, i.e. the voltage $V_C$ at node C is smaller than a reference voltage $V_{ref}$ and, therefore, the voltage at node D is equal to 0. The reference voltage $V_{ref}$ is available in any electric circuit and by determining its value it is possible to determine a threshold for the resistance R 128 corresponding to the integrity of the passivation layer 108 being acceptable or not. Typically, the threshold is set to be at least 100 kOhm to ensure proper operation of the semiconductor device, but of course is not limited thereto. For example, it is possible to perform tests for different semiconductor devices and determine corresponding thresholds that ensure proper operation. The output signal provided at node D is, for example, digitized and stored in memory for further processing such as comparing with measurement results between other contact pads of the same substrate or when integrated in a manufacturing process for discarding defective devices at a later stage.

Figure 5:
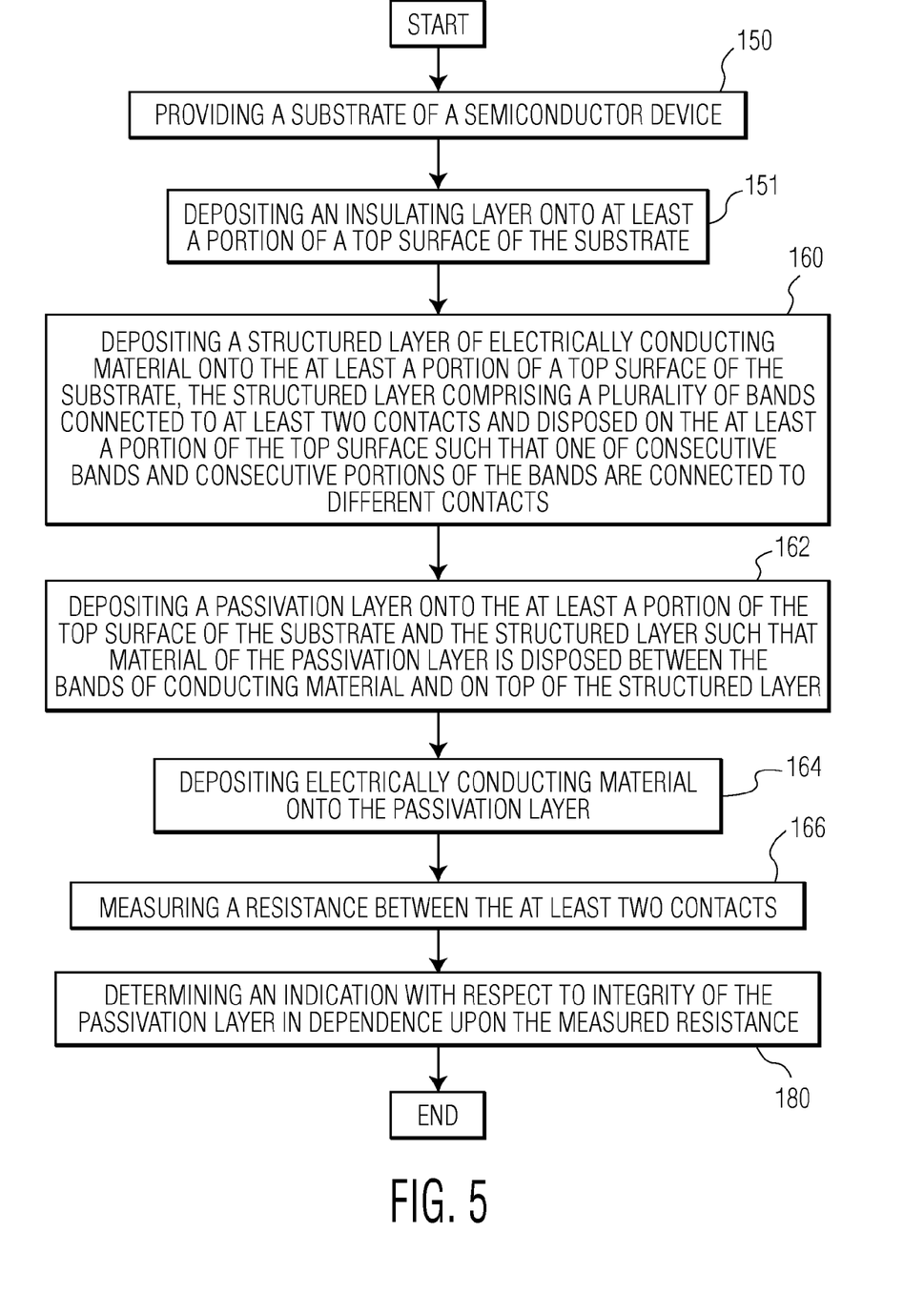
FIG. 5 a simplified flow diagram of a method for testing the integrity of a passivation layer according to the invention.

Referring to FIG. 5, a simplified flow diagram of a method for testing the integrity of a passivation layer according to the invention is shown. Reference is made to the devices shown in FIGS. 1, 2a, 2b, 3, and 4, above. At 150, a substrate of a semiconductor device is provided. A structured layer 104 of electrically conducting material is deposited onto at least a portion of a top surface of the substrate—at 160. A passivation layer 108 is then deposited onto the at least a portion of the top surface of the substrate 102 and the structured layer 104—at 162. Optionally, an electrically insulating layer is deposited onto the at least a portion of a top surface of the substrate 102—at 151—and the structured layer 104 and the passivation layer 108 are deposited thereupon. Electrically conducting material is then deposited onto the passivation layer 108—at 164. After deposition of the electrically conducting material a resistance between the at least two contact pads 106.1 and 106.2 is measured—at 166—and an indication with respect to integrity of the passivation layer 108 in dependence upon the measured resistance is determined—at 180.

For example, steps 150 to 162 are performed after manufacturing of the substrates having a finishing, while the steps 164 to 180 are performed after backend grinding and sawing of the wafer, which are stressful processing stages potentially resulting in cracks in the passivation layer 108. Optionally, the device is provided to the customer after processing step 162 and steps 164 to 180 are performed by the customer, thus enabling detection of defects caused during shipping. Further optionally, the electric circuitry 120 is incorporated into the semiconductor device and the contact pads are connected thereto, enabling a self-integrity test by the semiconductor device. It is noted that through the deposition of metal at defect locations in the passivation layer 108—at step 164— also visual inspection of the integrity of the passivation layer 108 is facilitated and enables detection of otherwise invisible defects.

Figure 6:
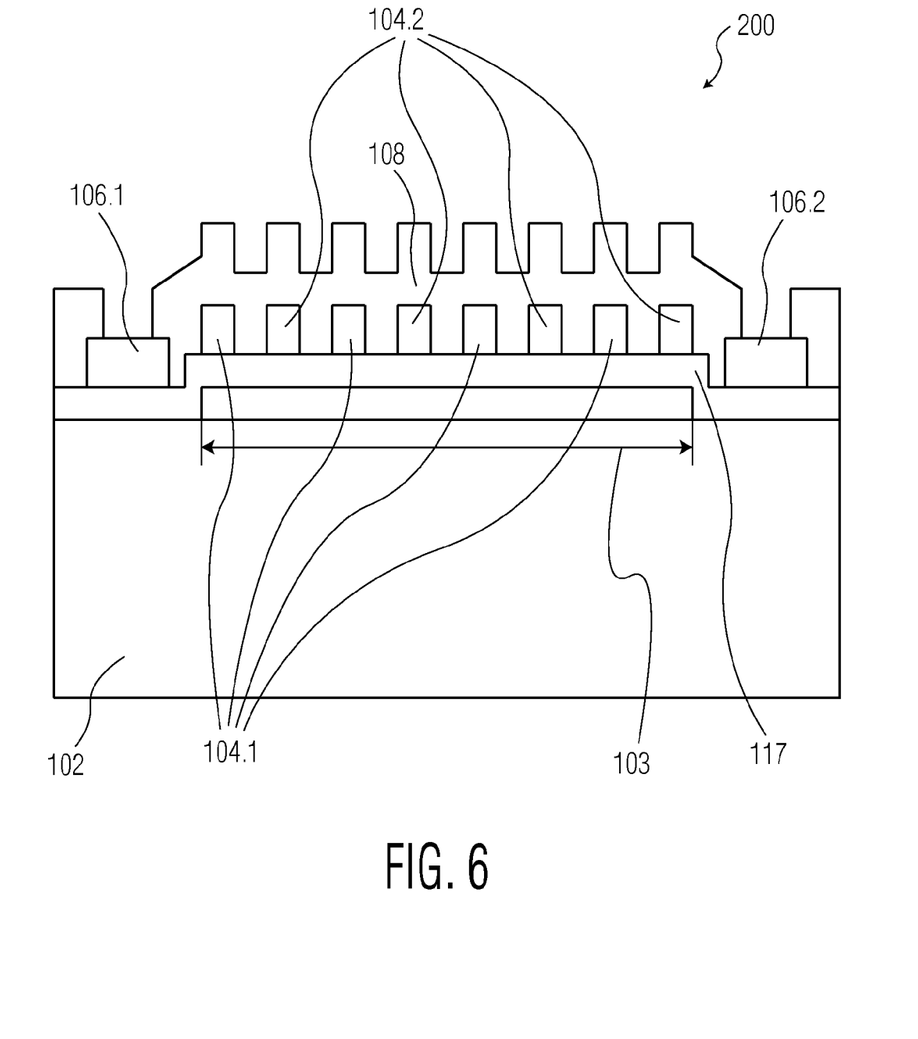
FIG. 6 is a simplified block diagram illustrating a cross-sectional view of a substrate of a semiconductor device having a second embodiment of an embedded structure for testing the integrity of a passivation layer according to the invention; and, FIGS. 7a and 7b are simplified block diagrams of top views of two embodiments of a layer of electrically conducting material according to the invention of the embedded structure shown in FIG. 6.

Referring to FIG. 6, a cross-sectional view of a substrate of a semiconductor device having a second embodiment of an embedded structure 200 for testing the integrity of a passivation layer according to the invention is shown. The second embodiment 200 comprises the same components as the first embodiment 100 which are indicated by same reference numerals. On at least a portion of a top surface of the substrate 102 covering, for example, an area 103 above functional components of a chip such as, for example, a System On a Chip (SoC), a layer of electrically conducting material 115 followed by a layer of electrically insulating material 117— for example, an oxide layer such as $SiO_2$—is disposed.

The electrically insulating layer 117 is then followed by the same components as the first embodiment illustrated above. Optionally, an electrically insulating layer—for example, an oxide layer such as $SiO_2$—is interposed between the top surface of the substrate 102 and the layer of electrically conducting material 115, for example, when the substrate 102 has a metal layer as finishing.

Figure 7A:
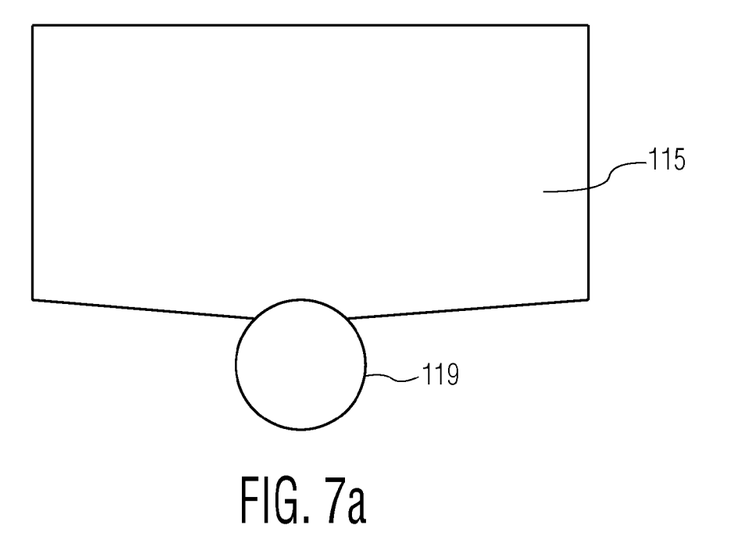
Figure 7B:
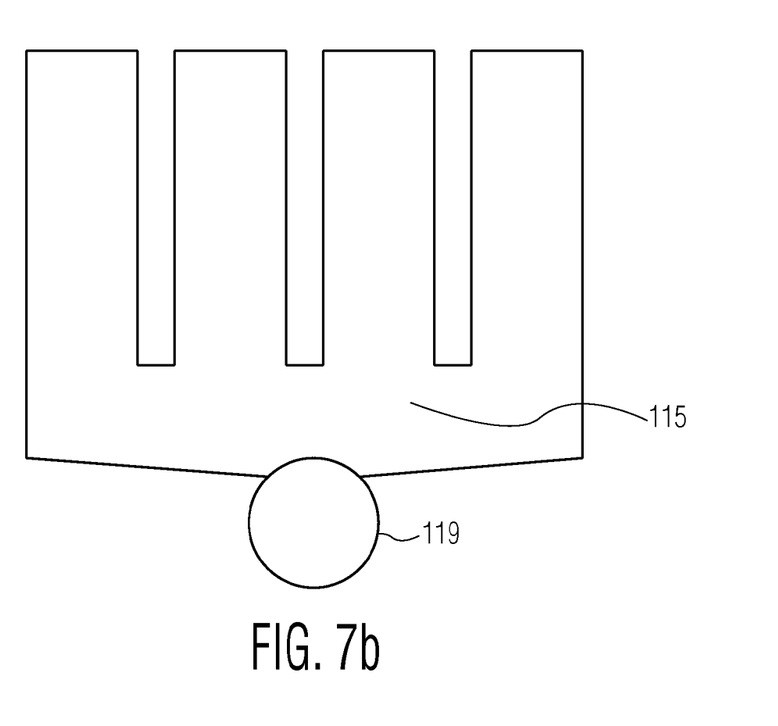

The layer of electrically conducting material 115 comprises, for example, a flat plate, as illustrated in FIG. 7a, or a plurality of bands, as illustrated in FIG. 7b, oriented, for example, parallel to the bands of the structured layer 104 or at an angle thereto. For example, the layer of electrically conducting material 115 is made of a metal such as aluminum, copper, or gold using, for example, standard thin film deposition techniques. The electrically insulating layer 117 is made of, for example, an oxide such as $SiO_2$, using, for example, standard thin film deposition techniques.

The presence of the layer of electrically conducting material 115 increases the sensitivity of the measurements to defects in the passivation layer 108. Furthermore, it is possible to provide the layer of electrically conducting material 115 with a contact pad 119, enabling measurement of a resistance between the contact pad 119 and at least one of the contact pads 106.1 and 106.2 for detecting defects in the electrically insulating layer 117.

As is evident, the measurements are performed in a similar fashion using, for example, the electric circuitry 120 as described above for measuring there resistance between the contact pads 106.1 and 106.2 as well as for measuring the resistance between the contact pad 119 and at least one of the contact pads 106.1 and 106.2.

Numerous other embodiments of the invention will be apparent to persons skilled in the art without departing from the spirit and scope of the invention as defined in the appended claims.

What is claimed is:

1. A method comprising:
   providing a substrate of a semiconductor device;
   providing a structured layer of electrically conducting material onto at least a portion of a top surface of the substrate, the structured layer comprising a plurality of bands connected to at least two contacts and disposed on the at least a portion of the top surface such that one of consecutive bands and consecutive portions of the bands are connected to different contacts;
   depositing a passivation layer onto the at least a portion of the top surface of the substrate and the structured layer such that material of the passivation layer is disposed between the bands of conducting material and on top of the structured layer;
   depositing electrically conducting material onto the passivation layer;
   measuring a resistance between the at least two contacts; and,
   determining an indication with respect to integrity of the passivation layer in dependence upon the measured resistance.

2. A method as defined in claim 1 comprising:
   interposing a layer of electrically conducting material having a contact and a layer of electrically insulating material between the top surface of the substrate and the structured layer;
   measuring a resistance between the contact of the layer of electrically conducting material and at least one of the at least two contacts of the structured layer; and,
   determining an indication with respect to integrity of the layer of electrically insulating material in dependence upon the measured resistance.

3. A method as defined in claim 1, wherein depositing electrically conducting material onto the passivation layer comprises electroless Ni/immersion gold deposition.

4. A system comprising:
   a substrate of a semiconductor device;
   a structured layer of electrically conducting material disposed on at least a portion of a top surface of the substrate, the structured layer comprising,
      a plurality of bands connected to at least two contacts being disposed such that one of consecutive bands and consecutive portions of the bands are connected to different contacts,
      the at least two contacts for being connected to electric circuitry for measuring a resistance between the at least two contacts and for providing a measurement signal in dependence thereupon,
      the measurement signal being indicative of an integrity of a passivation layer deposited onto the at least a portion of the top surface of the substrate, and
      the structured layer, the passivation layer being deposited such that material of the passivation layer is disposed between the bands of conducting material and on top of the structured layer, and
   a layer of electrically conducting material and a layer of electrically insulating material interposed between the top surface of the substrate and the structured layer.

5. A system as defined in claim 4, wherein the layer of electrically conducting material comprises a contact for being connected to the electric circuitry for measuring a resistance between the contact of the layer of electrically conducting material and at least one of the at least two contacts of the structured layer.

6. A system comprising:
a substrate of a semiconductor device;
a structured layer of electrically conducting material disposed on at least a portion of a top surface of the substrate, the structured layer comprising,
a plurality of bands connected to at least two contacts being disposed such that one of consecutive bands and consecutive portions of the bands are connected to different contacts,
the at least two contacts for being connected to electric circuitry for measuring a resistance between the at least two contacts and for providing a measurement signal in dependence thereupon,
the measurement signal being indicative of an integrity of a passivation layer deposited onto the at least a portion of the top surface of the substrate, and
the structured layer, the passivation layer being deposited such that material of the passivation layer is disposed between the bands of conducting material and on top of the structured layer, and
wherein the bands of the structured layer comprise a predetermined width and wherein the one of consecutive bands and consecutive portions of the bands are disposed at a uniform predetermined distance to each other and thereby providing the resistance for each of the connective portions of the bands.

7. A system as defined in claim 6, wherein the width and the distance are determined such that detecting of pinholes in the passivation layer is enabled.

8. A system comprising:
a substrate of a semiconductor device;
a structured layer of electrically conducting material disposed on at least a portion of a top surface of the substrate, the structured layer comprising,
a plurality of bands connected to at least two contacts being disposed such that one of consecutive bands and consecutive portions of the bands are connected to different contacts,
the at least two contacts for being connected to electric circuitry for measuring a resistance between the at least two contacts and for providing a measurement signal in dependence thereupon,
the measurement signal being indicative of an integrity of a passivation layer deposited onto the at least a portion of the top surface of the substrate, and
the structured layer, the passivation layer being deposited such that material of the passivation layer is disposed between the bands of conducting material and on top of the structured layer, and
wherein the electrically conducting material has been deposited onto the passivation layer using electroless Ni/immersion gold deposition.

* * * * *